United States Patent [19]

Woods et al.

[11] Patent Number: 4,675,273

[45] Date of Patent: Jun. 23, 1987

[54] RESISTS FORMED BY VAPOR DEPOSITION OF ANIONICALLY POLYMERIZABLE MONOMER

[75] Inventors: John G. Woods, Dublin; John M. Rooney, Kildare, both of Ireland

[73] Assignee: Loctite (Ireland) Limited, Dublin, Ireland

[21] Appl. No.: 828,107

[22] Filed: Feb. 10, 1986

[51] Int. Cl.$^4$ .................... G03C 5/00; C23C 16/00; B05D 5/12
[52] U.S. Cl. ............................ 430/325; 430/326; 430/327; 430/330; 156/643; 427/255.6; 427/82
[58] Field of Search ............... 430/325, 326, 327, 330; 156/643; 427/255, 255.6, 82

[56]         References Cited

U.S. PATENT DOCUMENTS

| | | | |
|---|---|---|---|
| 2,313,501 | 3/1943 | Bachman et al. | 260/485 |
| 2,330,033 | 9/1943 | D'Alelio | 260/485 |
| 2,502,412 | 4/1950 | Ardis | 260/465-8 |
| 2,514,387 | 7/1950 | Gilbert | 260/465-8 |
| 2,663,725 | 12/1953 | Reuter et al. | 260/465-8 |
| 2,665,298 | 1/1954 | Ardis | 260/465-8 |
| 2,748,050 | 5/1956 | Shearer et al. | 154/140 |
| 3,027,278 | 3/1962 | Reick | 117/226 |
| 3,197,318 | 7/1965 | Halpern et al. | 106/208 |
| 3,221,745 | 12/1965 | Coover et al. | 128/334 |
| 3,523,097 | 8/1970 | Coover et al. | 260/30.6 |
| 3,922,449 | 11/1975 | Bolger | 428/542 |
| 3,979,406 | 9/1976 | D'Alelio | 260/307 C |
| 4,175,963 | 11/1979 | Crivello | 430/296 |
| 4,279,984 | 7/1981 | Matsuda et al. | 430/270 |
| 4,395,481 | 1/1983 | Birkle et al. | 430/326 |
| 4,477,607 | 10/1984 | Litke | 523/212 |
| 4,533,422 | 8/1985 | Litke | 156/307.3 |
| 4,539,250 | 9/1985 | Fuji et al. | 428/195 |
| 4,543,275 | 9/1985 | Akashi et al. | 427/250 |
| 4,550,041 | 10/1985 | Thompson et al. | 428/35 |
| 4,557,978 | 12/1985 | Mason | 428/457 |
| 4,604,344 | 8/1986 | Irving et al. | 430/325 |

FOREIGN PATENT DOCUMENTS

| | | | |
|---|---|---|---|
| 0151372 | 8/1985 | European Pat. Off. | G03F/07/16 |
| 21332 | 6/1980 | Japan . | |
| 105244 | 8/1980 | Japan . | |
| 1168000 | 10/1969 | United Kingdom . | |
| 1298453 | 12/1972 | United Kingdom | C23C/13/04 |

OTHER PUBLICATIONS

IBM Technical Disclosure Bulletin vol. 16, No. 11, Apr. 1974, Chem. Abst. 99: 185932 (Abstract of J83 123727).
Chem. Abst. 99: 159393 (Abstract of J 83 108213).
Derwent Abstract, WPI Acc. #82: 56185E/27 (Abstract for J 83 87404).

*Primary Examiner*—John E. Kittle
*Assistant Examiner*—Patrick J. Ryan
*Attorney, Agent, or Firm*—Vidas & Arrett

[57]           ABSTRACT

A method for applying a polymeric resist coating of very high molecular weight to a suitable substrate without the necessity of elaborate purification steps and for ensuring adequate coverage of raised regions in three-dimensionally patterned substrates. The method comprises exposing the substrate to be coated to the vapor of an anionically polymerizable monomer of the formula:

$$CHR=CXY$$

where X and Y are strong electron withdrawing groups and R si H or, provided that X and Y are both —CN, $C_1$-$C_4$ alkyl for sufficient time to deposit a polymerizable coating thereon. Particularly preferred monomers are 2-cyanoacrylate esters. The monomer condenses and polymerizes on the surface of the substrate to give a highly uniform high molecular weight polymeric coating which is useful as a resist coating in lithographic processes employing plasma or acid etch techniques.

20 Claims, No Drawings

RESISTS FORMED BY VAPOR DEPOSITION OF ANIONICALLY POLYMERIZABLE MONOMER

BACKGROUND OF THE INVENTION

The use of polymeric alkyl cyanoacrylates as resist materials for microlithography is known in the art. For example: *IBM Technical Disclosure Bulletin*, Vol. 16, No. 11, April 1974, p. 3745, discloses the use of poly methyl alpha cyanoacrylate homopolymers and copolymers as high-speed positive electron-beam resists; Japan Pat. No. 80/21,332 discloses the use of poly butyl cyanoacrylate as a positive-working high sensitivity electron-beam resist; Japan Pat. No. 80/105,244 discloses the use of poly ethyl cyanoacrylate as a positive-working electron-beam resist; U.S. Pat. No. 4,279,984 discloses the use of homopolymers and copolymers of lower alkyl cyanoacrylates as positive-working high-energy radiation resists; Eur. Pat. No. 48,899 discloses the use of copolymers of alkyl cyanoacrylates as positive-working resists; Japan Pat. No. 82/87,404 discloses the use of polymeric fluoroalkyl cyanoacrylates as electron beam resists; Japan Pat. No. 83/113,933 discloses the use of copolymers of fluoroalkyl acrylates and alkyl cyanoacrylates as resist materials; Japan Pat. No. 83/108,213 discloses the use of alkyl cyanoacrylate polymers as positive-working radiation resists; and Japan Pat. No. 83/123,727 discloses the use of alkyl cyanoacrylate polymers and azido crosslinking agents as negative-working radiation resists.

In the prior art, the method of applying the resist materials to the substrate is by spin-coating a solution of the cyanoacrylate polymer onto the substrate. This procedure requires that the polymer is prepared in advance of the application and then dissolved in a suitable solvent. The solution must be filtered to remove particles of dust before application. After application, the coated substrate must be baked to remove residual solvent. Preparation of cyanoacrylate polymers in large quantities is complicated by the high reactivity of the monomers and the strongly exothermic nature of the polymerization.

After polymerization, the polymeric cyanoacrylate must then be precipitated to remove impurities such as initiators and inhibitors, a procedure which consumes large amounts of solvent. The purified polymer must then be redissolved in a suitable solvent for spin-coating. This requirement places a limitation on the types of solvent and polymer molecular weights which may be used. For example, poly methyl cyanoacrylate is soluble in very few solvents, such as nitromethane and dimethylformamide. In general, it is very difficult to spin-coat films of cyanoacrylate polymers with molecular weights in excess of 1,000,000, as stated in U.S. Pat. No. 4,279,984, Col. 2, lines 23-28. However, films formed from polymers below this molecular weight are easily removed by common organic solvents necessitating shortened developing times as stated in U.S. Pat. No. 4,279,984, Col. 3, lines 60-68 and Col. 4, lines 1-9. A further disadvantage of the spin-coating process is that attempts to coat a patterned substrate result in uneven coating thicknesses, i.e., the coating is thicker in depressed regions than in raised regions. One method of overcoming this problem involves the use of multilayer resists. However, applying two or three layers and using two or three image development steps increases the cost and complexity of the lithographic process.

Cyanoacrylate monomer vapors have recently been utilized as a fingerprint developer. A detailed discussion of such techniques is included in U.S. Pat. No. 4,550,041.

SUMMARY OF THE INVENTION

The present invention provides a method for applying a polymeric resist coating of very high molecular weight to a suitable substrate without the necessity of elaborate purification steps and for ensuring adequate coverage of raised regions in three-dimensionally patterned substrates.

The invention comprises exposing the substrate to be coated to the vapor of an anionically polymerizable monomer of the formula:

$$CHR=CXY \quad I,$$

where X and Y are strong electron withdrawing groups and R is H or, provided that X and Y are both —CN, $C_1$-$C_4$ alkyl for sufficient time to deposit a polymerizable coating thereon. Particularly preferred monomers are 2-cyanoacrylate esters. The monomer condenses and polymerizes on the surface of the substrate to give a highly uniform high molecular weight polymeric coating which is useful as a resist coating in lithographic processes employing plasma or acid tech techniques.

The method is especially useful in microlithographic processes for producing semiconductor devices on silicon chips.

A further aspect to the invention comprises a process in which an etchable substrate is coated with polymer as described above; the coated substrate is subsequently imaged using high energy radiation; the image is developed by conventional solvent development processes; the image is etched using a suitable plasma or acid etching process, and the resist coating is subsequently removed by heating the coating to a temperature above the polymer depolymerization temperature.

A still further aspect of the invention comprises a substrate etchable by acid or plasma etching processes which has been coated with a high molecular weight cyanoacrylate polymer formed by vapor deposition of cyanoacrylate monomer on the substrate.

The inventive process can be utilized to produce uniform etch resistant coatings of less than 0.1 micron thick.

DETAILED DESCRIPTION OF THE INVENTION

The preferred monomers for use in the inventive process are cyanoacrylate ester monomers. The cyanoacrylate monomers are well known and many are commercially available as "instant" adhesives. The monomers have the formula

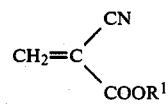

wherein $R^1$ represents a hydrocarbyl or substituted hydrocarbyl group such as a straight chain or branched chain alkyl group having 1 to 12 carbon atoms (which may be substituted with a substituent such as a halogen atom or an alkoxy group) a straight chain or branched chain alkenyl group having 2 to 12 carbon atoms, a straight chain or branched chain alkynyl group having 2 to 12 carbon atoms, a cycloalkyl group, an aralkyl group or an aryl group. Specific examples of the groups for $R^1$ are a methyl group, an ethyl group, an n-propyl group, an isopropyl group, an n-butyl group, an isobutyl group, a pentyl group, a hexyl group, an allyl group, a methallyl group, a crotyl group, a propargyl group, a cyclohexyl group, a benzyl group, a phenyl group, a cresyl group, a 2-chloroethyl group, a 3-chloropropyl group, a 2-chlorobutyl group, a trifluoroethyl group, a 2-methoxyethyl group, a 3-methoxybutyl group and a 2-ethoxyethyl group.

Preferred cyanoacrylates are alkyl cyanoacrylates having 1-6 carbon atoms. Ethyl and isobutyl cyanoacrylates are especially preferred.

The monomer vapors are most suitably generated from the monomers. This may be done at ambient temperatures and pressures but it is generally preferred to heat the monomers and/or reduce the atmospheric pressure above the monomer generated in the chamber in order to generate sufficient concentrations of vapor to accomplish the polymer deposition on the substrate in a reasonable time.

As an alternative to vapor generation from monomers, cyanoacrylate polymers which are heated above their depolymerization temperatures, typically about 150° C., may be used as a monomer vapor source. In particular, vapors generated from thermal removal of resist coatings may be recirculated, a feature which has significant environmental advantages.

Concentrated cyanoacrylate monomer vapors may also be generated by other techniques well known in the fingerprint development art and summarized in U.S. Pat. No. 4,550,041.

While the cyanoacrylate ester monomers are preferred because of their ready availability, better known handling properties and low depolymerization temperatures, other anionically polymerizable monomers encompassed within Formula I above may also be usefully employed. As used herein, the term strong electron withdrawing groups refers to groups which are more electron withdrawing than halo. Generally, the electron withdrawing groups X and Y may be independently selected from $-SO_2R$; $SO_3R$; $-CN$; $-COOR^1$ and $-COR^2$, where $R^1$ is as previously defined and $R^2$ is H or hydrocarbyl, preferably $C_1$-$C_{12}$ hydrocarbyl. Vinylidene cyanide, in particular, is known to give especially insoluble polymeric products, a characteristic which is useful where the image development step involves extensive solvent scrubbing. Vinylidene cyanide and its lower alkyl homologs may be obtained, for instance, by processes described in U.S. Pat. No. 2,313,501; 2,502,412; 2,514,387; 2,663,725, and 2,665,298, the disclosures of which are incorporated herein by reference. Other anionically polymerizable monomers within the scope of Formula I include: dialkyl methylene malonates as described in U.S. Pat. No. 2,330,033; 3,197,318; 3,221,745 and 3,523,097; acylacrylonitriles as described in GB 1,168,000; and vinyl sulfinates and sulfonates of the formula $CH_2=CXY$ where X is $-SO_2R^2$ or $-SO_3R^2$ and Y is $-CN$, $-COOR^2$, $-COCH_3$, $-SO_2R^2$ or $-SO_3R^2$, as described in U.S. Pat. No. 2,748,050.

The cyanoacrylate or other anionically polymerizable monomer vapors may be applied to any acid or plasma etchable substrate, particularly substrates used in microlithography. Suitable substrate materials include silicon dioxide, including $SiO_2$ coated silicon, metallic oxides, and glass, all of which may be etched by plasma or acid etching processes. Metallic substrates which can be etched by acid processes, such as copper coated epoxy/glass boards used in printed circuit board manufacture and metal printing plates may also be utilized in the inventive process.

The imaging, development and etching processes are conventional in the art for cyanoacrylate resist materials. Typically a high energy source such as deep UV (wavelength below 300 nm) and ionizing radiation sources, is used to produce the image. Ionizing radiation sources include electron beam, x-ray and gamma ray sources. Either direct write or photomask techniques may be employed to imagewise expose the substrate. After exposure, the image is developed by conventional solvent development techniques. Following image development, the substrate is etched by known acid or plasma etching techniques. The resist coating may then be removed by heating the substrate above the depolymerization temperature of the polymer, preferably under vacuum.

The preferred substrate is $SiO_2$ coated silicon, e.g., the silicone chips conventionally used in preparation of semiconductor devices. Most suitably, this substrate is etched by a plasma etching process. Surprisingly, the high molecular weight cyanoacrylate polymers produced by the inventive process have a significantly greater etch resistance than spin coated cyanoacrylate polymer resists.

Very high molecular weight polymer is formed by the inventive process. This is evidenced by the inability of agressive solvents to dissolve the coating. As noted above, however, the coating is readily removed by heating above the depolymerization temperature of the polymer. For cyanoacrylate polymers, the depolymerization temperature is only about 150°-200° C. so that coating removal step will not harm the typical substrate.

If the substrate surface is inherently active for inducing anionic polymerization of cyanoacrylates, or such other monomer within Formula I as may be employed, no surface treatment will be necessary to obtain the desired high molecular weight uniform coatings. In certain cases, however, where the substrate is slightly acidic or neutral it is necessary to activate the surface with a basic liquid or vapor which is substantially removed before exposing the substrate to the monomer vapor. Suitable activators include the known initiators for anionic or zwitterionic polymerization of alkyl cyanoacrylates. Especially suitable activators are organic amines and phosphines.

The invention is further illustrated by the following non-limiting examples.

EXAMPLE 1

Polished silicon wafers 3 inches in diameter were treated with activator as shown in Table 1. The activator was brushed uniformly across the wafer surface and allowed to evaporate. The wafer was then polished with a paper tissue to restore the mirror finish, and mounted with the treated surface covering the opening of a 250 ml polyethylene beaker into which 0.2 gram of ethyl cyanoacrylate monomer had been placed. The beaker was placed on top of a Tecam DB-3Dri-Block heating apparatus maintained at a block temperature of 85° C. After the time indicated in Table 1 had elapsed, the wafer was removed.

Lines were mechanically inscribed on the coated wafers to expose the wafer surfaces and coating depths were measured with a Nanospec polarized optical system. In Table 1, coating thicknesses are reported for the center of the wafer. The deposited coating was then carefully removed with a scalpel blade and checked for solubility. The coatings were found to be substantially insoluble in dichloromethane, indicating the formation of extremely high molecular weight poly(ethyl cyanoacrylate).

The amount of polymeric cyanoacrylate deposited was determined by weighing the wafers on a micro-balance before and after removal of the coating.

TABLE 1

| Activator: | Amt. g: | Expos. Time, Min: | Coating Thickness, $\mu$ | Coating Weight, mg: |
|---|---|---|---|---|
| None | — | 10 | 0 | 0 |
| N,N,N',N'—Tetramethyl Ethylene Diamine (TMEDA) | 0.1 | 3 | 0.77 | 3.0 |
| N,N—Diethyl Trimethyl-silyl Amine (DTMSA) | 0.1 | 6 | 2.0 | 7.5 |
| Triphenyl Phosphine: Dichloromethane (1:3 mixture) | 0.3 | 8 | 1.7 | 5.5 |

EXAMPLE 2

The experiment described in Example 1 was repeated using 0.1 g TMEDA activator and the cyanoacrylate monomers specified in Table 2.

TABLE 2

| Monomer | Exposure Time, Min: | Film Thickness, $\mu$ |
|---|---|---|
| Allyl cyanoacrylate | 3 | 0.3 |
| Methyl cyanoacrylate | 8 | 2.8 |

EXAMPLE 3

The experiment described in Example 1 was repeated using 0.1 g TMEDA activator and ethyl cyanoacrylate. At specified intervals the wafer was removed from the vapor and weighed on a microbalance. The amount of polymer deposited on the wafer after various exposure times is recorded in Table 3.

TABLE 3

| Exposure Time, min: | Weight Increase, mg: |
|---|---|
| After Activator Treatment | 0 |
| 2 | 2.6 |
| 4 | 4.4 |
| 6 | 6.3 |

EXAMPLE 4

A polished silicon wafer 3 inches in diameter was mounted perpendicular to the shaft of a stirring motor with a variable speed adjustment. The surface of the wafer was activated with TMED according to the procedure of Example 1. The wafer was then rotated at a speed of about 100 revolutions per minute and lowered into a 1 liter polyethylene beaker containing 0.2 grams of ethyl cyanoacrylate monomer. The wafer was lowered to a depth of about 10 cm above the bottom of the beaker which has been heated to 85° as described in Example 1. After 3 minutes exposure, the wafer was removed and the thickness of the deposited polymeric coating was measured at 12 points across the surface of the wafer. A uniform coating of 0.06 microns had been deposited with a variation of less than 0.003 microns across the surface.

EXAMPLE 5

The experiment outlined in Example 4 was repeated except that the beaker conained 0.4 grams of ethyl cyanoacrylate, the rotation speed was 35 r.p.m. and the exposure time was 4 minutes. A uniform coating of 0.15 microns was deposited with a variation of less than 0.006 microns across the surface.

EXAMPLE 6

The experiment outlined in Example 1 was repeated using TMEDA and ethyl cyanoacrylate. The substrate was a silicon wafer on which a pattern of relief images had been etched. The coated wafer was then sectioned and examined under a scanning electron microscope. The coating was found to follow the contours of the substrate more closely than a comparable coating applied by spinning from solution.

EXAMPLE 7

Silicon wafers were coated with the polymeric cyanoacrylate esters listed in Table 4 by each of two methods: by a conventional spin-coating (SC) technique in which high molecular weight polycyanoacrylates were dissolved in nitromethane and applied to the wafer surface; and by the vapor-coating (VC) technique outlined in Example 4. Coated wafers were then placed in a platen plasma reactor and etched under a $CF_4$: $CHF_3$: Ar atmosphere. The rate of resist etching was measured on each sample together with the rate of $SiO_2$ etching and the results are summarized in Table 4.

TABLE 4

| Resist Polymer Ester (Coating Method) | $SiO_2$ Etch Rate Å/Min | Resist Etch Rate Å/Min | Etch Ratio |
|---|---|---|---|
| Ethyl (SC) | 79 | 134 | 1.70 |
| Ethyl (VC) | 79 | 53 | 0.67 |
| i-Butyl (SC) | 85 | 100 | 1.18 |
| i-Butyl (VC) | 73 | 38 | 0.52 |
| n-Buty (SC) | 88 | 104 | 1.18 |
| n-Butyl (VC) | 71 | 51 | 0.72 |
| Allyl (SC) | 71 | 43 | 0.61 |
| Allyl (VC) | 60 | 36 | 0.60 |

For dry-process compatibility in microcircuit fabrication, it is desirable that a resist material etch at a lower rate than $SiO_2$, i.e. that the ratio cited in Table 4 be less than 1.0. From the data it can be seen that resists deposited by the method of this invention are superior to those deposited by the conventional technique.

In a related application, the inventors herein disclose a novel imaging process in which a substrate active or activated to induce polymerization of an anionically polymerizable monomer, CHR=CXY, is treated with a photosensitive compound which releases an acid when irradiated. The treated substrate is then irradiated imagewise after which it is exposed to monomer vapors as disclosed herein. The resulting polymer coating forms only on the area not exposed to radiation, thereby producing an imaged positive coating on the substrates. Example 8 illustrates this process on a glass substrate.

EXAMPLE 8

A glass microscope slide (1"×4") was treated with 2 drops of UVE-1014, which were brushed uniformly across the surface of the slide. The slide was then polished with a paper tissue, and exposed through a patterned mask to the output of a medium-pressure mercury arc (200 watts per linear inch power rating) at a distance of 10 centimeters for 20 seconds. At the end of this time, the mask was removed and the slide was mounted perpendicular to the shaft of a stirring motor with a variable speed adjustment. The slide was rotated at a speed of about 35 revolutions per minute and lowered into a 1 liter polyethylene beaker containing 0.5 grams of ethyl cyanoacrylate monomer. The slide was lowered to a depth about 10 cm above the bottom of the beaker, which was heated to a temperature of about 50° C. on a hot plate apparatus. After 3 minutes exposure, the slide was removed from the vapor. A relief image corresponding to the pattern of the mask had been developed on the surface of the slide.

What is claimed is:

1. A method of providing a resist coating on an acid or plasma etchable substrate comprising exposing the substrate to the vapor of an anionically polymerizable monomer of the formula $$CHR=CXY$$

where X and Y are strong electron withdrawing groups and R is H or, provided X and Y are both cyano groups, $C_1$–$C_4$ alkyl, for sufficient time to deposit a polymerized coating of the monomer on the substrate.

2. A method as in claim 1 where the monomer is selected from 2-cyanoacrylate esters, vinylidene cyanide and its $C_1$–$C_4$ alkyl homologs, dialkyl methylene malonates, acylacrylonitriles, and vinyl sulfinates or sulfonates of the formula $CH_2=CXY$ where X is —$SO_2R^2$ or $SO_3R^2$ and Y is selected from —CN, —$COOR^2$, —$COCH_3$, —$SO_2R^2$ or —$SO_3R^2$, and $R^2$ is H or hydrocarbyl.

3. A method as in claim 2 where the monomer is cyanoacrylate ester.

4. A method as in claim 3 where the monomer is ethyl or isobutyl cyanoacrylate.

5. A method as in claim 1 wherein the substrate is $SiO_2$ coated silicon.

6. A method as in claim 1 wherein the substrate has a surface activated to induce polymerization of the monomer by treatment with an initiator of anionic or zwitterionic polymerization of alkyl cyanoacrylates.

7. A method as in claim 6 wherein the initiator is an organic amine or phosphine.

8. A method of providing an imagewise etched surface on a substrate etchable by plasma or acid etching techniques comprising:
    coating the surface of the substrate with a polymeric resist coating by exposing the substrate to the vapor of an anionically polymerizable monomer of the formula $$CHR=CXY$$

where X and Y are strong electron withdrawing groups and R is H or, provided that X and Y are both cyano, $C_1$–$C_4$ alkyl; imagewise exposing the substrate to deep UV or ionizing radiation;
    developing the image;
    etching the substrate; and
    removing the resist coating by heating the coating to a temperature above the polymer depolymerization temperature.

9. A method as in claim 8 wherein the substrate is silicon coated with $SiO_2$.

10. A method as in claim 8 where the monomer is a cyanoacrylate ester.

11. A method as in claim 8 where the monomer is vinylidene cyanide or a $C_1$–$C_4$ alkyl homolog thereof.

12. A method as in claim 8 where the monomer is a dialkyl methylenemalonate.

13. A method as in claim 8 wherein the substrate surface is treated with an initiator of anionic zwitterionic polymerization of alkyl cyanoacrylates prior to exposing the substrate to the monomer vapor.

14. A method as in claim 13 wherein the anionic initiator is an organic amine or phosphine.

15. A method as in claim 10 wherein the substrate surface is selected from acid etchable metals, $SiO_2$, glass and metalic oxides.

16. A method as in claim 10 wherein the resist coating removal step comprises heating the coating to a temperature between 150° and 200° C.

17. An article having a surface etchable by acid or plasma etching techniques and a polymeric resist coating over said etchable surface, the resist coating comprising a polymer formed by vapor deposition onto the etchable substrate surface of an anionically polymerizable monomer of the formula $$CH_2=CXY$$

where X and Y are strong electron withdrawing groups, for sufficient time to form said polymeric coating.

18. An article as in claim 17 wherein the monomer is a cyanoacrylate monomer.

19. An article as in claim 18 wherein the polymeric coating thickness is less than 0.1 micron thick.

20. An article as in claim 18 wherein the etchable substrate surface is $SiO_2$.

UNITED STATES PATENT AND TRADEMARK OFFICE
CERTIFICATE OF CORRECTION

PATENT NO. : 4,675,273
DATED : June 23, 1987
INVENTOR(S) : John G. Woods et al

It is certified that error appears in the above-identified patent and that said Letters Patent are hereby corrected as shown below:

Column 2, line 27, delete "tech" and insert - etch -

Column 5, line 20, delete "0.1" and insert at end of line 19 -- 0.1 --

Column 7, line 27, insert "that" before "X and Y"

Signed and Sealed this

Twenty-fourth Day of November, 1987

Attest:

DONALD J. QUIGG

*Attesting Officer*   *Commissioner of Patents and Trademarks*